(12) United States Patent
Kikuchi et al.

(10) Patent No.: US 12,298,358 B2
(45) Date of Patent: May 13, 2025

(54) RESISTANCE WIRE ABNORMALITY DETECTION DEVICE

(71) Applicant: SHINKAWA LTD., Tokyo (JP)

(72) Inventors: Hiroshi Kikuchi, Tokyo (JP); Shinsuke Fukumoto, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 18/016,354

(22) PCT Filed: Jul. 28, 2021

(86) PCT No.: PCT/JP2021/027957
§ 371 (c)(1),
(2) Date: Jan. 15, 2023

(87) PCT Pub. No.: WO2023/007628
PCT Pub. Date: Feb. 2, 2023

(65) Prior Publication Data
US 2024/0175941 A1 May 30, 2024

(51) Int. Cl.
*G01R 31/58* (2020.01)

(52) U.S. Cl.
CPC .................... *G01R 31/58* (2020.01)

(58) Field of Classification Search
CPC ......... G01R 31/58; G01R 23/16; H02M 3/01; H02H 7/1213; Y02T 10/7072
(Continued)

(56) References Cited

U.S. PATENT DOCUMENTS 8,493,073 B2 * 7/2013 Yamamoto ........... G01R 27/025
324/541
2013/0267943 A1 * 10/2013 Hancock ................ H05B 6/806
606/33
(Continued)

FOREIGN PATENT DOCUMENTS

JP H10275833 10/1998
JP H11132484 5/1999
(Continued)

OTHER PUBLICATIONS

"International Search Report (Form PCT/ISA/210) of PCT/JP2021/027957," mailed on Oct. 5, 2021, pp. 1-3.
(Continued)

*Primary Examiner* — Huy Q Phan
*Assistant Examiner* — Trung Q Nguyen
(74) *Attorney, Agent, or Firm* — JCIPRNET

(57) ABSTRACT

An electric circuit abnormality detection device includes a pulse generator, a directional coupler, and a detection unit. The detection unit includes a reference reflected wave database and a calculation part. The reference reflected wave database stores waveform information of a reference reflected wave inputted from the directional coupler when a pulse signal is inputted to a reference electric circuit that has a same wiring pattern as a pulse heater and does not have an abnormality. The calculation part detects an abnormality in the pulse heater by comparing waveform information of a reflected wave inputted from the directional coupler when the pulse signal is inputted to the pulse heater, with waveform information of the reference reflected wave stored in the reference reflected wave database.

1 Claim, 4 Drawing Sheets

(58) Field of Classification Search
USPC ....... 324/537, 400, 500, 600, 764.01, 103 R, 324/771, 761.01, 501
See application file for complete search history.

(56) References Cited

U.S. PATENT DOCUMENTS

| | | | | |
|---|---|---|---|---|
| 2019/0148112 | A1* | 5/2019 | Kaneko | H01J 37/32229 156/345.24 |
| 2020/0366086 | A1* | 11/2020 | Dent | H02H 9/005 |
| 2023/0322115 | A1* | 10/2023 | Sung | B60L 53/305 |

FOREIGN PATENT DOCUMENTS

| | | |
|---|---|---|
| JP | 3277862 | 4/2002 |
| JP | 2009250761 | 10/2009 |
| JP | 2010025890 | 2/2010 |
| JP | 2017044662 | 3/2017 |
| WO | 2016117375 | 7/2016 |

OTHER PUBLICATIONS

"Office Action of Korea Counterpart Application", with English translation thereof, issued on Feb. 12, 2025, pp. 1-5.

\* cited by examiner

RESISTANCE WIRE ABNORMALITY DETECTION DEVICE

CROSS-REFERENCE TO RELATED APPLICATION

This application is a 371 application of the International PCT application serial no. PCT/JP2021/027957, filed on Jul. 28, 2021. The entirety of the above-mentioned patent application is hereby incorporated by reference herein and made a part of this specification.

TECHNICAL FIELD

The present invention relates to an electric circuit abnormality detection device which detects an abnormality in an electric circuit.

RELATED ART

In a conventional flip-chip bonding method, a conductive bonding material such as a solder bump or gold bump is placed between a wiring part in a semiconductor chip and a substrate, and the conductive bonding material is heated and melted by a heater to bond the semiconductor chip to the substrate. This method involves a pulse heater capable of rapidly raising the temperature of the entire bonding portion where the gold bump is present by heating to thermally melt the conductive bonding material, and then rapidly lowering the temperature of the bonding portion by cooling to solidify the conductive bonding material (for example, see Patent Document 1).

However, the pulse heater may deteriorate due to repeated rapid temperature rise and rapid temperature drop, and the resistance wire may break. Therefore, a method has been proposed to detect a resistance value of the resistance wire of the pulse heater to detect disconnection according to an increase in the resistance value (for example, see Patent Document 2).

RELATED ART DOCUMENT(S)

Patent Document(s)

Patent Document 1: Japanese Patent Application Laid-Open No. H10-275833
Patent Document 2: Japanese Patent No. 3277862

SUMMARY OF INVENTION

Problem to be Solved by Invention

However, since the resistance value of the resistance wire of the pulse heater increases upon heat generation due to energization, in the method described in Patent Document 2, in the case of an abnormal state in which the wire is partially disconnected, an increase in the resistance value due to an abnormality in the pulse heater might sometimes be intermingled with an increase in the resistance value due to heat generation during energization, and an abnormality in the pulse heater might not be detected at an early stage. Further, in a pulse heater which repeats rapid temperature rise and cooling, there is a possibility that rapid temperature rise may occur when the wire is broken, so there is a demand for detecting the abnormality at an early stage.

Accordingly, an objective of the present invention is to detect an abnormality in an electric circuit at an early stage.

Means for Solving Problem

An electric circuit abnormality detection device according to the present invention includes a pulse generator, a directional coupler, and a detection unit. The pulse generator inputs a pulse signal to an electric circuit. The directional coupler is provided between connection lines connecting between the electric circuit and the pulse generator and extracts, from the electric circuit, a reflected wave of the pulse signal inputted from the pulse generator to the electric circuit. The detection unit is connected to the directional coupler and processes the reflected wave inputted from the directional coupler to detect an abnormality in the electric circuit. The detection unit includes a storage part and a calculation part. The storage part stores waveform information of a reference reflected wave inputted from the directional coupler when the pulse signal is inputted to a reference electric circuit that has a same wiring pattern as the electric circuit and does not have an abnormality. The calculation part detects an abnormality in the electric circuit by comparing waveform information of the reflected wave inputted from the directional coupler when the pulse signal is inputted to the electric circuit, with waveform information of the reference reflected wave stored in the storage part.

In this manner, a pulse signal is inputted to the electric circuit and the waveform information of the reflected wave reflected by the electric circuit is compared with the waveform information of the reference reflected wave to perform detection of an abnormality in the electric circuit. Thus, abnormality detection can be performed without being affected by a change in the resistance value due to a temperature rise of the electric circuit. Accordingly, it is possible to detect, at an early stage, an abnormality such as partial disconnection, in which an increase in the resistance value due to an abnormality in the electric circuit is intermingled with an increase in the resistance value due to heat generation during energization.

The electric circuit abnormality detection device according to the present invention may include a low-pass filter provided between the directional coupler and the detection unit. The electric circuit may include a plurality of reflection sources which reflect the pulse signal inputted from the pulse generator. The reflected wave and the reference reflected wave inputted to the detection unit may have a waveform obtained after passing, through the low-pass filter, a composite reflected wave in which a plurality of individual reflected waves reflected by the plurality of reflection sources are superimposed. After a magnitude of the reflected wave exceeds a predetermined threshold value, the calculation part of the detection unit may detect an abnormality in the electric circuit in a case where a difference between the magnitude of the reflected wave and a magnitude of the reference reflected wave exceeds a predetermined range.

Accordingly, it is possible to reliably detect an abnormality in an electric circuit including a plurality of reflection sources, such as a long electric circuit with many bends.

In the electric circuit abnormality detection device according to the present invention, the electric circuit and the reference electric circuit may be heaters in which a resistance wire is arranged in a plurality of turns.

Accordingly, an abnormality in the heater can be detected at an early stage.

Effects of Invention

The present invention enables detecting an abnormality in an electric circuit at an early stage.

DESCRIPTION OF EMBODIMENTS

An electric circuit abnormality detection device 10 according to an embodiment will be described below with reference to the drawings. In the following description, the electric circuit abnormality detection device 10 will be described to detect an abnormality in a resistance wire 33 of a pulse heater 30 shown in FIG. 2, but it is also possible to apply the electric circuit abnormality detection device 10 to detection of an abnormality in an electric circuit other than this.

Figure 1:
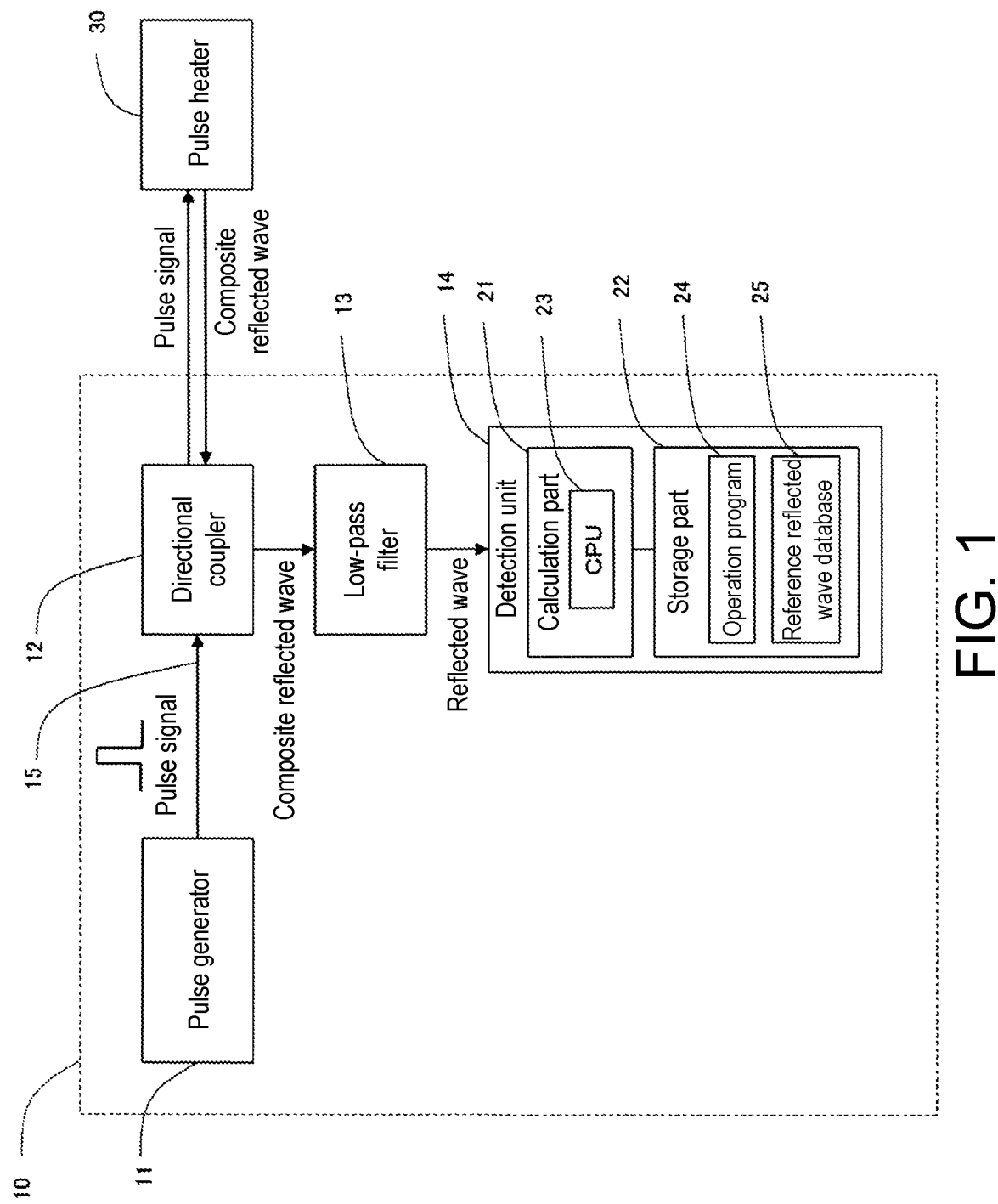
FIG. 1 is a system view showing a configuration of an electric circuit abnormality detection device according to an embodiment.

As shown in FIG. 1, the electric circuit abnormality detection device 10 is composed of a pulse generator 11, a directional coupler 12, a low-pass filter 13, and a detection unit 14.

The pulse generator 11 outputs a rectangular or triangular pulse signal to the resistance wire 33 (see FIG. 2) of the pulse heater 30, which is an electric circuit. The directional coupler 12 is a device that is provided between connection lines 15 connecting between the pulse heater 30 and the pulse generator 11 and extracts, from the pulse heater 30, a composite reflected wave of the pulse signal inputted from the pulse generator 11 to the pulse heater 30. The low-pass filter 13 removes high-frequency noise from the composite reflected wave inputted from the directional coupler 12 to output a reflected wave to the detection unit 14. The detection unit 14 processes the reflected wave inputted from the low-pass filter 13 to detect an abnormality in the resistance wire 33 of the pulse heater 30.

The detection unit 14 is composed of a calculation part 21 and a storage part 22. The calculation part 21 includes a CPU 23 which is a processor that performs information processing inside. The storage part 22 is connected to the calculation part 21 and stores an operation program 24 and a reference reflected wave database 25 containing waveform information of reference reflected waves. The detection unit 14 may be composed, for example, of a general-purpose computer.

Figure 2:
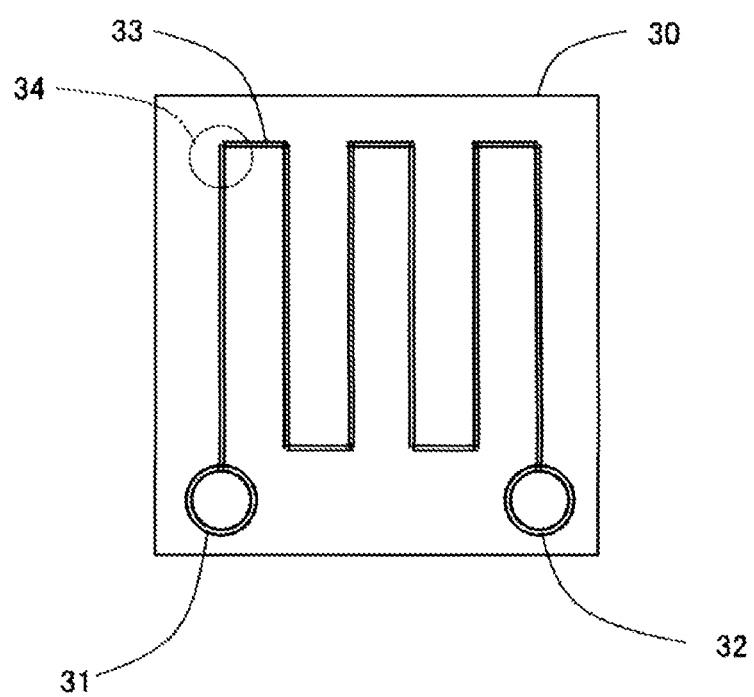
FIG. 2 is a plan view showing an electric circuit of a pulse heater on which the electric circuit abnormality detection device of the embodiment performs abnormality detection.

As shown in FIG. 2, the resistance wire 33 of the pulse heater 30, which is the target of abnormality detection, is arranged in a plurality of turns between an input terminal 31 and an output terminal 32 and includes a plurality of bends 34. The pulse signal outputted from the pulse generator 11 and entering the resistance wire 33 is reflected respectively by the plurality of bends 34 to form individual reflected waves, which are reflected from the resistance wire 33 toward the pulse generator 11.

Since the resistance wire 33 is long and has the plurality of bends 34, a plurality of individual reflected waves are reflected from the resistance wire 33 toward the pulse generator 11. These individual reflected waves form a composite reflected wave superimposed while traveling through the resistance wire 33. The composite reflected wave contains large high-frequency noise.

The composite reflected wave that has entered the directional coupler 12 from the pulse heater 30 is extracted by the directional coupler 12 and inputted to the low-pass filter 13. A signal from which high-frequency noise has been removed by the low-pass filter 13 is inputted to the detection unit 14 as a reflected wave as shown in FIG. 3.

Figure 3:
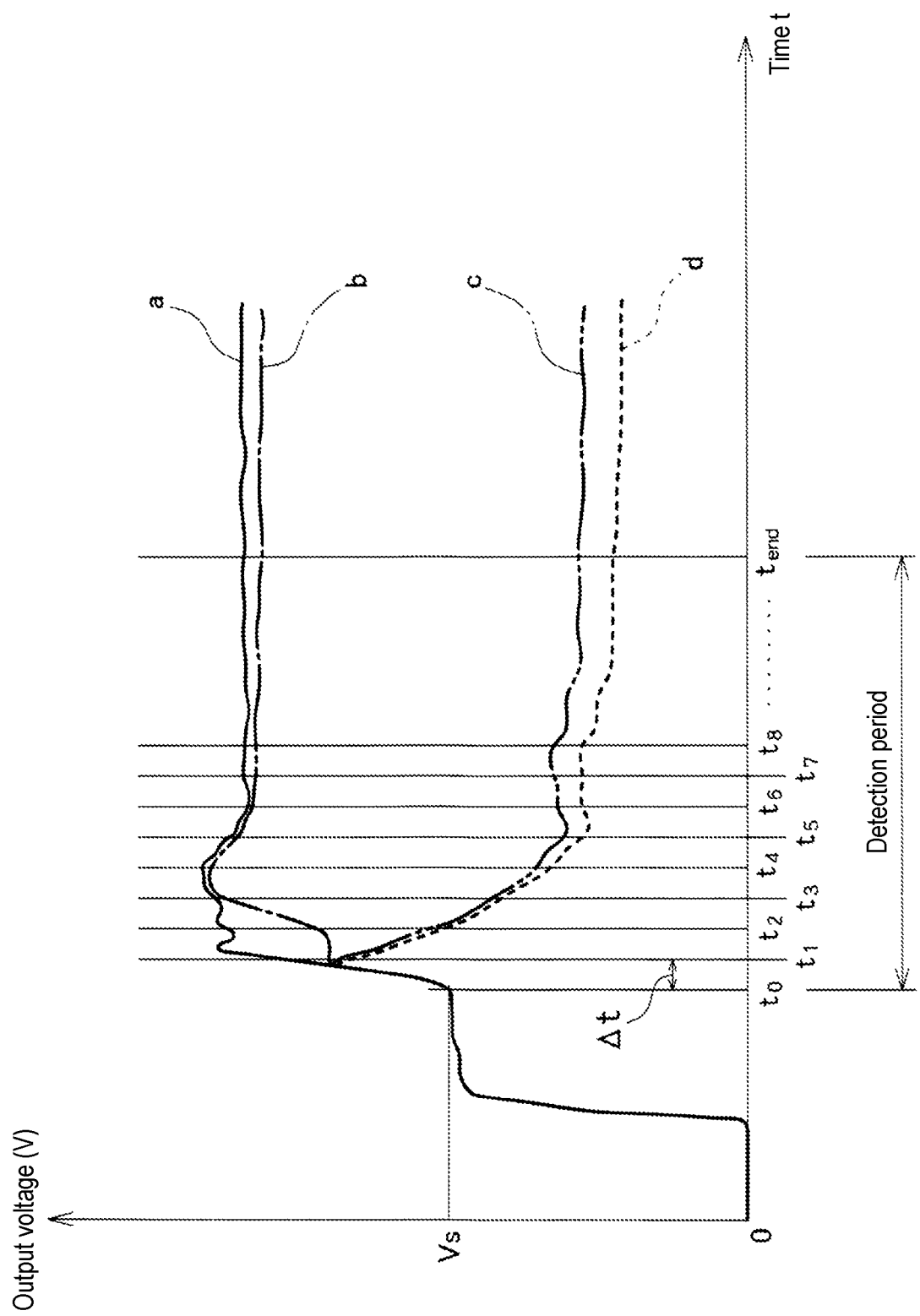
FIG. 3 is a graph showing overtime changes in reflected waves from the pulse heater inputted to a detection unit of the electric circuit abnormality detection device of the embodiment when a pulse signal is inputted to the pulse heater.

As shown in FIG. 3, the waveform of the reflected wave varies diversely depending on the degree of abnormality. A solid line a shown in FIG. 3 indicates a case where there is no abnormality in the resistance wire 33; a dot-dashed line b and a double-dot-dashed line c indicate cases of an abnormality of partial disconnection; a dashed line d indicates a case of an abnormality of complete disconnection. Herein, partial disconnection refers to a case where the cross-sectional area of a part of the resistance wire 33 is less than the normal state, and, for example, the dot-dashed line b shows the waveform of a reflected wave in a state in which a minute crack that does not break the resistance wire 33 has occurred. The double-dot-dashed line c shows the waveform of a reflected wave in a case of a state in which a crack in the resistance wire 33 is larger and the loss of the cross-sectional area is larger than in the case of the dot-dashed line b.

As shown by the solid line a in FIG. 3, in a normal state in which there is no abnormality such as breakage in the resistance wire 33, an output voltage value of the reflected wave rises to reach a predetermined threshold value Vs at time t0, then the output voltage value rapidly increases from time t0, and becomes a substantially constant output voltage value over time. In the case of a resistance wire 33 with a minute crack as indicated by the dot-dashed line b, after time t0, the output increases in the same manner as the solid line a with no break until time t1; after time t1, the output voltage value increases in a stepwise manner with a slight delay from the solid line a, and over time, becomes a substantially constant output voltage value slightly smaller than in the case where there is no abnormality as indicated by the solid line a. For this reason, the difference between the output voltage value of a reflected wave from a normal resistance wire 33 with no abnormality as indicated by the solid line a, and the output voltage value of a reflected wave from a resistance wire 33 in the case of an abnormality of partial disconnection due to a minute crack as indicated by the dot-dashed line b becomes large after time t1 shown in FIG. 3, and afterwards, the difference becomes small.

Even in the case of an abnormality of partial disconnection, if the disconnection area becomes large, as indicated by the double-dot-dashed line c, the waveform of the reflected wave approaches the waveform of a reflected wave in a case of an abnormality of complete disconnection as indicated by the dashed line d. In this case, the output voltage value temporarily increases after time t0, but then begins to decrease at time t1, and over time, becomes a substantially constant output voltage value that is much smaller than the waveform of the normal state with no abnormality. Similarly, also in the case of complete breakage, after time t0, the output voltage value temporarily increases, but then begins to decrease after time t1, and over time, becomes a substantially constant output voltage value that is much smaller than the waveform of the normal state with no abnormality. The substantially constant output voltage value at this time is slightly smaller than in the case of partial disconnection of the double-dot-dashed line c. For this reason, the difference between the output voltage value of a reflected wave from a normal resistance wire 33 with no abnormality as indicated by the solid line a, and the output voltage value of a reflected wave from a resistance wire 33 in a case where there is an abnormality such as partial disconnection as indicated by the double-dot-dashed line c or complete disconnection as indicated by the dashed line d gradually increases after time t1 shown in FIG. 3.

Herein, the reference reflected wave database 25 stored in the storage part 22 will be described. The reference reflected wave database 25 stored in the storage part 22 takes, as a reference electric circuit, a reference pulse heater that does not have an abnormality and has the same wiring pattern as the resistance wire 33 of the pulse heater 30 which is the target of abnormality detection, and stores, as overtime changes of a reference voltage value of a reference reflected wave, overtime changes in the output voltage value of the reflected wave inputted from the low-pass filter 13 when a pulse signal is inputted from the pulse generator 11 to this reference pulse heater. In other words, the overtime changes in the waveform of the reflected wave indicated by the solid line a in FIG. 3 are stored as waveform information. The reference reflected wave database 25 may serve as, for example, a database storing overtime changes in the reference voltage value of the reference reflected wave with respect to time, from the time when the reference voltage value of the reference reflected wave becomes larger than the predetermined threshold value Vs. As the wiring pattern of the resistance wire 33 of the pulse heater 30 is different, the waveform of the reflected wave will be different. Thus, the reference reflected wave database 25 stores waveform information of a plurality of reference reflected waves for each type of wiring pattern of the resistance wire 33 of the pulse heater 30.

The operation of the electric circuit abnormality detection device 10 will be described below with reference to FIG. 4. As shown in step S101 in FIG. 4, the pulse generator 11 is caused to emit a pulse signal. Then, a signal of a reflected wave from the low-pass filter 13 is inputted to the detection unit 14, as shown from time 0 to time t0 in FIG. 3.

Figure 4:
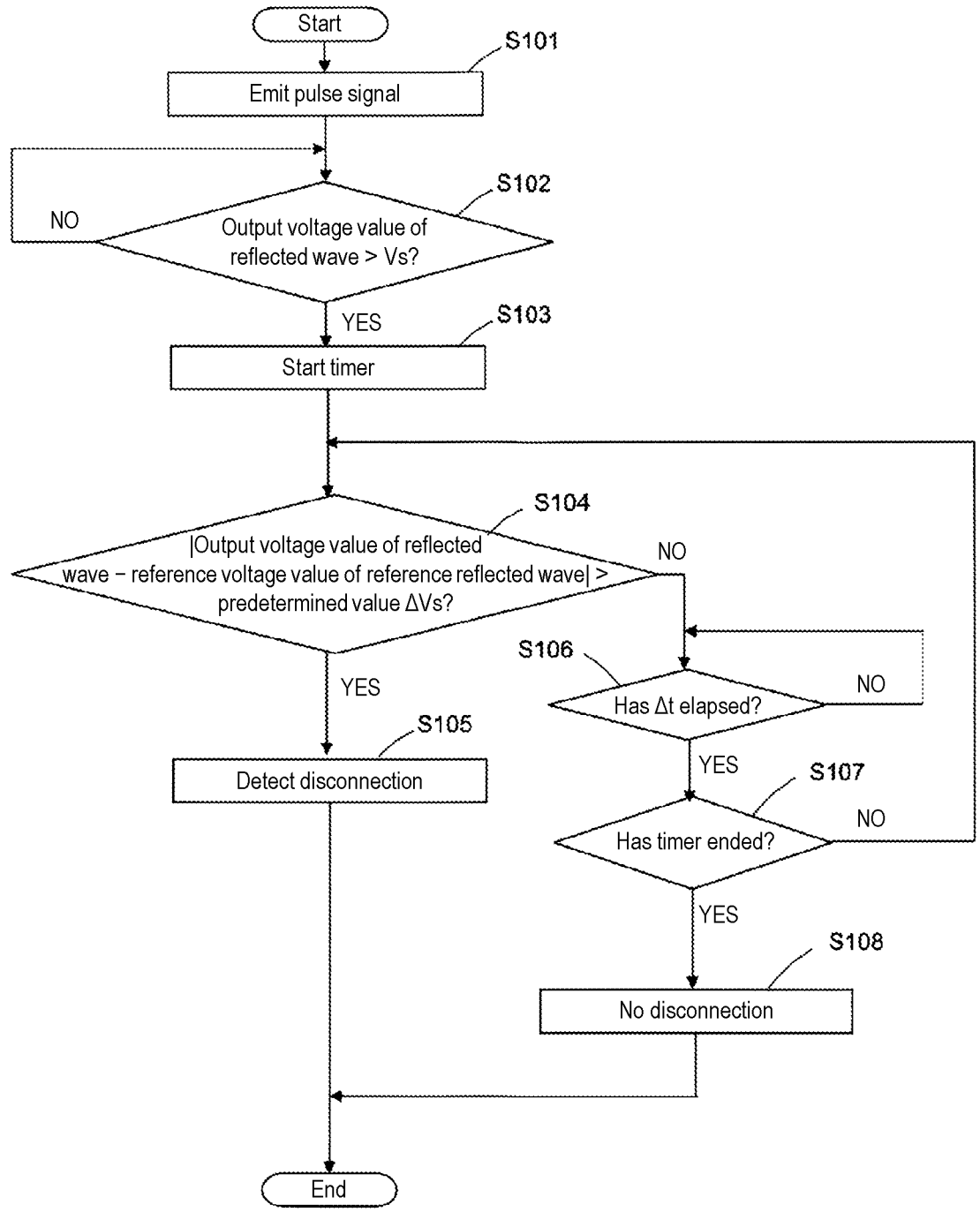
FIG. 4 is a flowchart showing operation of the electric circuit abnormality detection device of the embodiment.

As shown in step S102 in FIG. 4, the calculation part 21 of the detection unit 14 stands by until an output voltage value of the inputted reflected wave exceeds a predetermined threshold value Vs. Since the output voltage value reaches the threshold value Vs at time t0 shown in FIG. 3, the calculation part 21 determines "YES" in step S102 at time t0 shown in FIG. 3, proceeds to step S103 in FIG. 4, and starts a timer that defines a detection period shown in FIG. 3. Then, proceeding to step S104 in FIG. 4, the calculation part 21 calculates a difference ΔV between the output voltage value of the reflected wave at time t0 and a reference voltage value of a reference reflected wave stored in the reference reflected wave database 25, and determines whether an absolute value of the difference ΔV exceeds a predetermined value ΔVs. Herein, the output voltage value of the reflected wave at time t0 is the waveform information of the reflected wave at time t0, and the reference voltage value of the reference wave at time t0 is the waveform information of the reference wave at time t0.

At time t0 shown in FIG. 3, since the output voltage values of the waveforms of the three reflected waves indicated by the dot-dashed line b, the double-dot-dashed line c, and the dashed line d are substantially the same as the output voltage value of the waveform indicated by the solid line a, which is the same as the waveform of the reference reflected wave, the calculation part 21 determines "NO" in step S104 in FIG. 4, proceeds to step S106 in FIG. 4, and stands by until a detection interval Δt shown in FIG. 3 elapses. Then, at time t1 after the detection interval Δt elapses from time to, in step S107 in FIG. 4, it is determined whether the timer has ended. If "NO" is determined in step S107 in FIG. 4, returning to step S104 in FIG. 4, the difference ΔV between the output voltage value of the reflected wave at time t1 and the reference voltage value of the reference reflected wave stored in the reference reflected wave database 25 is calculated, and it is determined whether an absolute value of the difference ΔV exceeds the predetermined value ΔVs.

At time t1, although the output voltage values of the waveforms of the three reflected waves indicated by the dot-dashed line b, the double-dot-dashed line c, and the dashed line d exhibit a slight difference from the output voltage value of the waveform indicated by the solid line a, which is the same as the waveform of the reference reflected wave, since the difference does not reach the predetermined value ΔVs, the calculation part 21 determines "NO" in step S104 in FIG. 4 again, proceeds to step S106 in FIG. 4, and stands by until a next detection interval Δt elapses. In step S107, if the timer has not ended, the process returns to step S104 in FIG. 4.

As shown in FIG. 3, at time t2, since the output voltage values of the waveforms of the three reflected waves indicated by the dot-dashed line b, the double-dot-dashed line c, and the dashed line d exhibit a difference of the predetermined value ΔVs or more from the output voltage value of the waveform indicated by the solid line a, which is the same as the waveform of the reference reflected wave, the calculation part 21 determines "YES" in step S104 in FIG. 4, proceeds to step S105 in FIG. 4, and outputs an abnormality detection.

If determining "NO" at time t2 shown in FIG. 3, the calculation part 21 executes steps S106 and S107 in FIG. 4. If determining "YES" in step S107 in FIG. 4, the calculation part 21 determines that during the detection period, there is no difference between the output voltage value of the reflected wave and the reference voltage value of the reference reflected wave, the waveform of the reflected wave does not differ from the waveform of the reference reflected wave, and there is no abnormality in the resistance wire 33 of the pulse heater 30 which is the abnormality detection target, and the calculation part 21 outputs a signal "no abnormality" in step S108.

As described above, the electric circuit abnormality detection device 10 of the embodiment inputs a pulse signal to the pulse heater 30 and compares the waveform information of the reflected wave reflected by the resistance wire 33 of the pulse heater 30 with the waveform information of the reference reflected wave to perform abnormality detection on the resistance wire 33 of the pulse heater 30. Thus, abnormality detection on the resistance wire 33 can be performed without being affected by a change in the resistance value due to a temperature rise of the resistance wire 33. Accordingly, it is possible to detect, at an early stage, an abnormality such as partial disconnection, in which an increase in the resistance value due to an abnormality in the pulse heater 30 is intermingled with an increase in the resistance value due to heat generation during energization.

Further, in the electric circuit abnormality detection device 10 of the embodiment, even if the resistance wire 33 includes a plurality of bends 34, which are reflection sources reflecting the pulse signal inputted from the pulse generator 11, the calculation part 21 of the detection unit 14 detects an abnormality when the difference in magnitude between a reflected wave and a reference reflected wave exceeds a predetermined range, the reflected wave being one obtained after passing, through the low-pass filter 13, a composite reflected wave in which a plurality of individual reflected waves reflected by a plurality of reflection sources are superimposed. Thus, even when the resistance wire 33 includes many bends 34 which are reflection sources, it is possible to suppress erroneous detection and reliably detect an abnormality in the resistance wire 33.

In the above description, it has been described that there is one predetermined value $\Delta Vs$, but the embodiment is not limited thereto, and a plurality of predetermined values may also be set. For example, an output voltage difference $\Delta Vs2$ between the dot-dashed line b and the solid line a at time t2 in FIG. 3 may be taken as a predetermined value, and an output voltage difference $\Delta Vs3$ between the double-dot-dashed line c and the solid line a at time t2 in FIG. 3 may be taken as a second predetermined value. An abnormality may be detected if a difference $\Delta V$ between the output voltage value of the reflected wave and the reference voltage value of the reference reflected wave stored in the reference reflected wave database 25 exceeds $\Delta Vs2$, and furthermore, it may be determined that partial disconnection, rather than complete disconnection, has occurred if $\Delta V$ is smaller than $\Delta Vs3$. Further, if $\Delta V$ exceeds $\Delta Vs3$, it may be determined as complete disconnection.

In the electric circuit abnormality detection device 10 described above, it has been described that the low-pass filter 13 is connected between the directional coupler 12 and the detection unit 14, a reflected wave from which high-frequency noise contained in the composite reflected wave from the resistance wire 33 of the pulse heater 30 has been removed is inputted to the detection unit 14, and the detection unit 14 detects an abnormality in the resistance wire 33 based on the inputted reflected wave. However, it is also possible that, without providing the low-pass filter 13, the composite reflected wave may be inputted to the detection unit 14 as it is to detect an abnormality in the resistance wire 33.

In this case, the calculation part 21 of the detection unit 14 may perform a calculation process on the inputted composite reflected wave, remove high-frequency noise, and generate a reflected wave to detect an abnormality in the resistance wire 33 based on the generated reflected wave. Further, waveforms and patterns of high-frequency noise may be detected in advance and stored in the reference reflected wave database, this data may be used to generate a reflected wave from which high-frequency noise has been removed, and an abnormality in the resistance wire 33 may be detected using the generated reflected wave. Alternatively, an abnormality in the resistance wire 33 may be detected according to a high-speed calculation process in which the calculation speed of the calculation part 21 of the detection unit 14 is set to a frequency that greatly exceeds the frequency of the high-frequency noise.

What is claimed is:

1. A resistance wire abnormality detection device for detecting abnormality in a resistance wire having a plurality of bends, the resistance wire abnormality detection device comprising:
   a pulse generator which inputs a pulse signal to the resistance wire;
   a directional coupler which is provided between connection lines connecting between the resistance wire and the pulse generator and extracts, from the plurality of bends of the resistance wire, a composite reflected wave in which a plurality of individual reflected waves of the pulse signal inputted from the pulse generator to the resistance wire are superimposed;
   a low-pass filter which is connected to the directional coupler and removes high-frequency noise from the composite reflected wave inputted from the directional coupler to output a reflected wave for detection;
   a detection unit which is connected to the low-pass filter and processes the reflected wave for detection inputted from the low-pass filter to detect an abnormality in the resistance wire; and
   wherein the detection unit comprises:
   a storage part which stores waveform information of a reference reflected wave inputted from the directional coupler when the pulse signal is inputted to the resistance wire that has a same shape as the the resistance wire and does not have an abnormality; and
   a calculation part which detects an abnormality in the resistance wire by comparing waveform information of the reflected wave for detection inputted from the directional coupler when the pulse signal is inputted to the resistance wire, with waveform information of the reference reflected wave stored in the storage part,
   wherein the calculation part detects an abnormality in the resistance wire when a difference between a magnitude of the reflected wave for detection and a magnitude of the reference reflected wave exceeds a first range that is predetermined,
   detects a complete disconnection in the resistance wire when the difference between the magnitude of the reflected wave for detection and the magnitude of the reference reflected wave exceeds a second range which is larger than the first range, and
   detects a partial disconnection in the resistance wire when the difference between the magnitude of the reflected wave for detection and the magnitude of the reference reflected wave exceeds the first range but is smaller than the second range.

* * * * *